(12) United States Patent
Benes

(10) Patent No.: US 6,603,301 B2
(45) Date of Patent: Aug. 5, 2003

(54) MULTIPLE RANGE CURRENT MEASUREMENT SYSTEM WITH LOW POWER DISSIPATION, FAST SETTING TIME, AND LOW COMMON MODE VOLTAGE ERROR

(75) Inventor: Michael J. Benes, Irvington, NJ (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/912,351

(22) Filed: Jul. 26, 2001

(65) Prior Publication Data

US 2003/0025514 A1 Feb. 6, 2003

(51) Int. Cl.[7] .............................................. G01R 15/08
(52) U.S. Cl. ..................... 324/115; 324/123 C; 324/523
(58) Field of Search ................................. 324/509, 512, 324/522, 523, 539, 543, 76.11, 123 C, 535, 115

(56) References Cited

U.S. PATENT DOCUMENTS

| 3,818,247 | A | * | 6/1974 | Chambers et al. | .......... 327/449 |
|---|---|---|---|---|---|
| 4,199,799 | A | * | 4/1980 | Ostenso et al. | ................ 361/78 |
| 4,293,813 | A | * | 10/1981 | Groenenboom | ......... 324/117 R |
| 5,003,523 | A | * | 3/1991 | Wachi et al. | ............ 369/44.34 |
| 5,515,001 | A | * | 5/1996 | Vranish | ................... 324/123 C |
| 5,744,965 | A | * | 4/1998 | Miller et al. | ................. 324/538 |
| 6,078,518 | A | * | 6/2000 | Chevallier | ............. 365/185.03 |
| 6,097,257 | A | * | 8/2000 | Kadowaki et al. | ..... 331/116 FE |
| 6,414,511 | B1 | * | 7/2002 | Janssen et al. | .............. 324/769 |
| 6,429,641 | B1 | * | 8/2002 | Montrose | ................ 324/123 C |

* cited by examiner

*Primary Examiner*—N. Le
*Assistant Examiner*—Timothy J. Dole

(57) ABSTRACT

A multi-range measuring circuit for measuring a flow of electrical current between a first node and a second node. A measurement resistor is connected to the first node to develop a voltage having a high range output. A summing node connected in series with the measurement resistor acts as an input to an amplifier for developing a second voltage having a low range output having a higher scale factor than the high range output. If the capacity of the amplifier to maintain the low range as a linear function is exceeded, a bypass circuit bypasses excess current flow to the second node.

20 Claims, 7 Drawing Sheets

MULTIPLE RANGE CURRENT MEASUREMENT SYSTEM WITH LOW POWER DISSIPATION, FAST SETTING TIME, AND LOW COMMON MODE VOLTAGE ERROR

CROSS REFERENCE TO RELATED APPLICATIONS

Not Applicable

BACKGROUND OF THE INVENTION

1. Field of the Invention

The present invention relates to a multiple range current measuring system and more particularly to a current measuring system having a low power loss, fast settling time and low common mode voltage error.

2. Description of the Related Art

Conventional dual range current measurement circuits include a parallel shunt and a series shunt configuration, as shown in FIGS. 1 and 2, respectively. These configurations have several disadvantages that warrant the need for an alternate topology to perform multiple range current measurements. These conventional circuits will be discussed along with their relative disadvantages.

Referring to FIG. 1, a current I1 is produced by an external source of current and is directed through measurement shunt resistance $R_H$ or $R_L$ by closing switch $S_H$ or $S_L$. Switches $S_H$ and $S_L$ are independently operated by external controls, which are not shown. Where a high range measurement is desired, switch $S_H$ is closed allowing current I1 to flow through $R_H$ to circuit common. With switch $S_H$ closed, a voltage drop develops across $R_H$ at the noninverting (+) and inverting (−) input terminals of high input impedance, fixed gain instrumentation amplifier U2. The gain of amplifier U2 is set to obtain a convenient volt per amp scale factor output voltage versus input current I1. Given the direction of current flow and the orientation of the input terminals of the amplifier U2 as shown in FIG. 1, a positive voltage ($I_{monH}$), with reference to circuit common, will result at the output of the instrumentation amplifier U2.

Switching from a high range measurement to a low range measurement in a minimally disruptive way requires closing switch $S_L$ in a make before break fashion and then opening switch $S_H$. By measuring a voltage drop across shunt $R_L$ with instrumentation amplifier U1, a voltage, I monitor low ($I_{monL}$) is developed with respect to the circuit common. Capacitor $C_L$ connected in parallel with relatively high value shunt resistance $R_L$, serves to filter noise and to provide a low dynamic impedance between the external source of current and circuit common. Using this measurement scheme, the value of shunt $R_L$ will be greater than the value of shunt $R_H$ to allow for more sensitive measurements of low level currents. In the arrangement of FIG. 1, either $I_{monH}$ or $I_{monL}$ is available, but not both simultaneously.

The series shunt arrangement operates in a manner somewhat similar to the operation of the parallel shunt configuration shown in FIG. 1. Referring now to FIG. 2, a current I1 flows from an external source through a resistor $R_H$ where a voltage drop is developed. This voltage drop is impressed upon the inverting (−) and non-inverting (+) terminals of the high input impedance, fixed gain instrumentation amplifier U2 producing the $I_{monH}$ voltage with reference to the circuit common. With $I_{monH}$ active and $I_{monL}$ not active a switch $S_L$ is closed across a shunt resistance $R_L$, allowing large currents to flow without a substantial voltage drop. To perform a low range measurement, the switch $S_L$ is opened allowing current flow through the shunt resistance $R_L$, permitting a low range measurement in a manner similar to the parallel arrangement of FIG. 1. During a low range measurement, current is also flowing through the resistor $R_H$, and thus the signal $I_{monH}$ is always available.

An alternate arrangement of the series shunt topology is shown with broken lines in FIG. 2. In the alternate arrangement, the switch $S_L$ is not used and a dual polarity shunt regulator SR1 is placed across $R_L$. A simple example of such a shunt regulator is shown as diodes D1 and D2. The configuration of FIG. 2 provides a bypass for $R_L$ without external switch control.

The series and parallel shunt configurations share disadvantages that warrant a need for a new topology. In both the series and parallel shunt arrangements, the insertion impedance of the measurement circuit may be larger than desired and the insertion impedance will change abruptly as various shunts are switched in and out of the circuit. Switching between measurement shunts contributes to settling time problems in the measuring circuit and causes disturbances in the external current flow due to the change in impedance of the measuring circuit.

The use of either solid state or mechanical relays in the circuits of FIG. 1 and FIG. 2 presents several areas of concern. In particular, complex switch control is required to change from one-measurement range to another. Switch control does not occur automatically and can result in shunts being overpowered if a high current is not diverted around the shunt $R_L$. In addition, if mechanical switches are used, contact bounce and lifetime become an issue. Solid state switches are prone to leakage and surge currents can damage solid state or mechanical switches.

The capacitor $C_L$, which is placed in parallel with the resistor $R_L$ in both topologies, results in a long settling time constant, increasing the time required to take an accurate reading of the $I_{monL}$ voltage signal. The capacitor $C_L$ may also cause measurement errors by leaking current around the shunt resistor $R_L$ which is in parallel with the capacitor $C_L$ in the circuits of FIGS. 1 and 2.

In the case of the series shunt arrangement that utilizes the shunt regulator SR1, significant power may be dissipated in the resistor $R_L$ and shunt regular SR1, especially for high values of current. Additionally, leakage currents in the shunt regulator SR1 can cause measurement errors in the $I_{monL}$ signal.

SUMMARY OF THE INVENTION

The present invention is a multi-range measuring circuit for measuring a flow of electrical current. An in-line sensor outputs a first signal proportional to the current and having a first scale factor. An amplifier circuit is serially connected with the in-line sensor and outputs a second signal having a second scale factor proportional to the current. A bypass circuit bypasses a portion of the input current around the amplifier circuit at values of the input current where the amplifier circuit is non-linear. The in-line sensor may be a resistor.

The bypass circuit comprises one of a P-type MOSFET, an N-type MOSFET or a P-type MOSFET parallel connected with an N-type MOSFET. The amplifier circuit comprises an inverting amplifier serially connected with a non-inverting amplifier and the non-inverting amplifier outputs the second signal. A control signal to operate the bypass circuit is output by a deadband circuit which is connected to the inverting amplifier. The deadband circuit is interposed between the output of the inverting amplifier and the bypass circuit. The deadband circuit passes the control signal where a value of the control signal is greater than a first predetermined value or less than a second predetermined value and rejects the control signal where the value of the control signal is intermediate the first and second predetermined values. The inverting amplifier operates in a first control loop where the deadband circuit rejects the control signal and operates in a second control loop where the deadband circuit passes the control signal.

The amplifier circuit comprises a summing node which receives the input current and the inverting amplifier is connected to the summing node. The non-inverting amplifier is connected to an output of the inverting amplifier and a feedback resistor is connected between an output of the non-inverting amplifier and the summing node, to regulate the second signal to be proportional to the current and according to the second scale factor. The deadband circuit comprises, for example, a diode network which determines the respective predetermined positive and negative values and the diode network comprises a plurality of series connected junction diodes.

BRIEF DESCRIPTION OF THE DRAWINGS

The present invention will become more apparent and more readily appreciated from the following description of the various embodiments, taken in conjunction with the accompanying drawings in which.

DETAILED DESCRIPTION OF THE INVENTION

Figure 1:
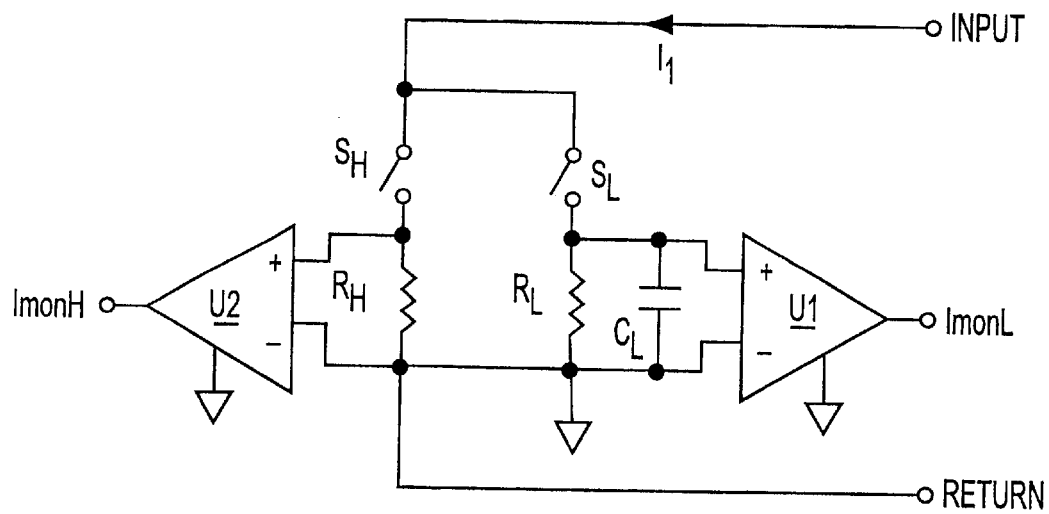
FIG. 1 is a schematic diagram of a conventional parallel shunt dual range measuring circuit.

Reference will now be made in detail to the embodiments of the present invention, examples of which are illustrated in the accompanying drawings, wherein like reference numerals refer to like elements throughout.

Figure 3:
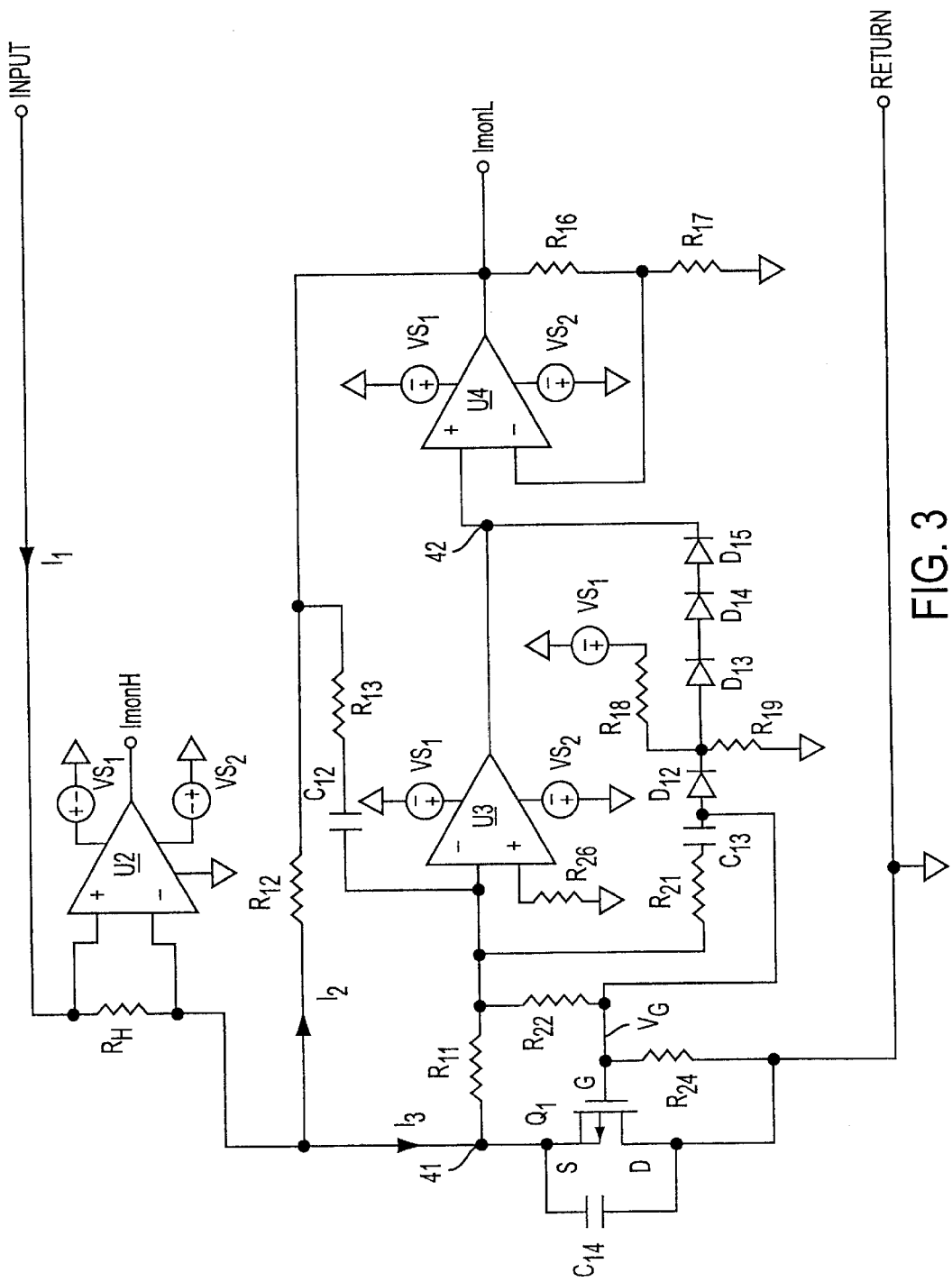
FIG. 3 is a schematic diagram of a unipolar embodiment of the present invention.
Figure 6:
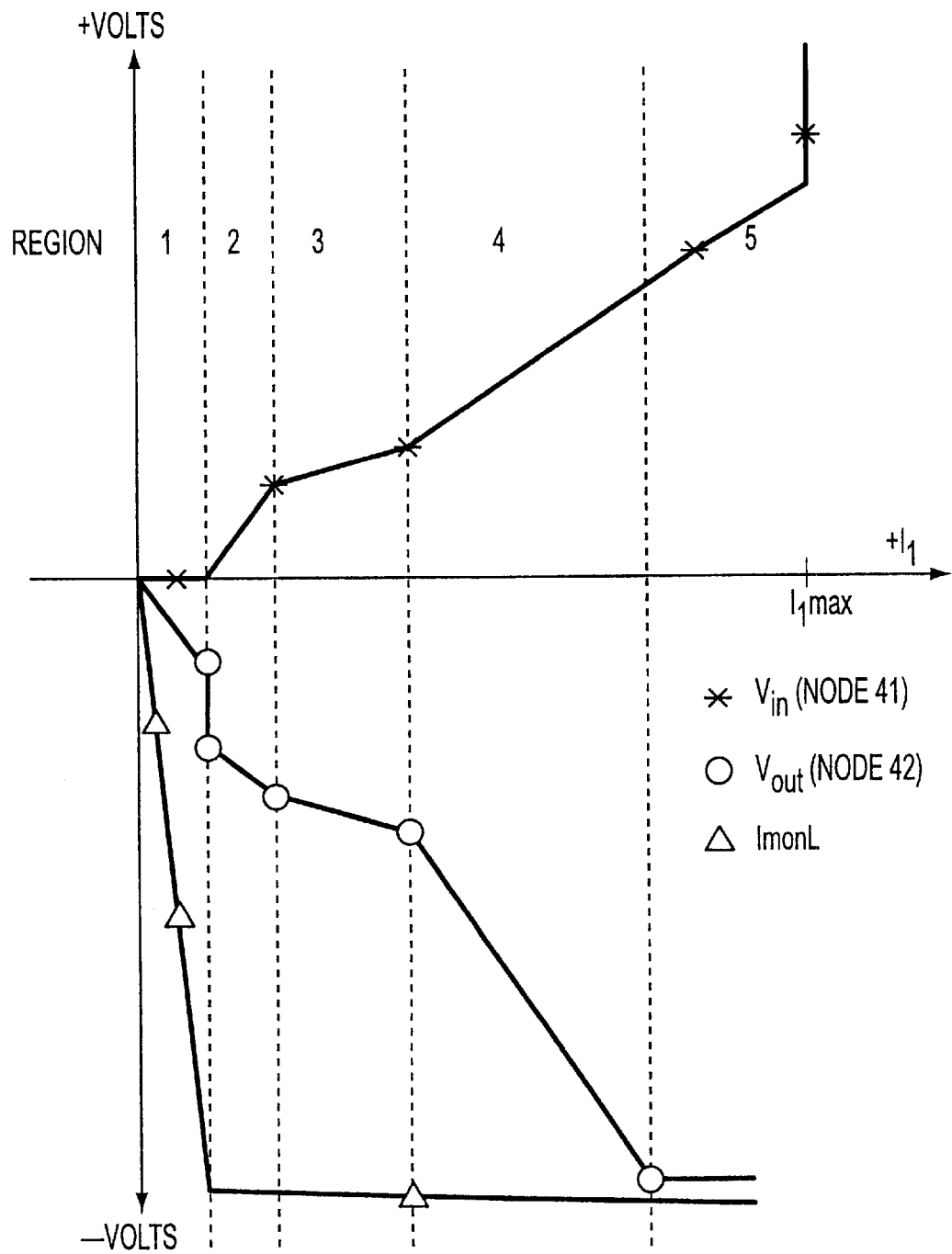
FIG. 6 is a plot of various voltages versus input current I1.

Referring now to FIG. 3, a unipolar multiple range current measuring circuit is illustrated. The measurement circuit of FIG. 3 operates by transitioning through five primary modes of operation as a current I1 increases from zero. Each of these modes will be discussed in detail with reference to the schematic of FIG. 3 and the input-output plots shown in FIG. 6. The input-output plots shown in FIG. 6 are also applicable to results for the bipolar current measurement system of FIG. 4. In order to simplify the explanations of the systems, system operation will be explained with reference to the unipolar measuring system of FIG. 3. The operation of the bipolar measurement of FIG. 4 and the portions of the input-output plots of FIG. 6 associated with the bipolar measurement system of FIG. 4 will be readily understood based on the explanations of the unipolar measurement system of FIG. 3.

The current I1, shown in FIG. 3, is produced by an external source of current and flows through the unipolar multiple range current measuring system and returns via a return node or terminal that is connected to circuit common. The current I1, flowing through a resistor $R_H$, produces a voltage difference across the inverting (−) and noninverting (+) input terminals of a high input impedance instrumentation amplifier U2. Given the direction of current flow as indicated by I1 and the orientation of the instrumentation amplifiers inputs as shown in FIG. 3, a positive voltage, I monitor high ($I_{monH}$) with reference to circuit common will result at the output of the amplifier U2. Assuming that the current I1 does not does not produce a voltage drop across $R_H$ large enough to clip instrumentation amplifier U2, the voltage $I_{monH}$ is always proportional to the current I1, independently of the operating region of the remainder of the measuring circuit. In general, since the $I_{monH}$ voltage is optimized to measure larger currents, there will be insufficient accuracy when attempting to measure low values of current. Hence, a low range measurement circuit is necessary.

Referring now to FIGS. 3 and 6, the operation of the circuit of FIG. 3, will be explained in conjunction with the various regions shown in FIG. 6. In FIG. 3, a node 41 operates as a summing junction for the current I1 flowing from the external current source and a feedback current I2 flowing through a resistor R12. During operation in Region 1, the $I_{monL}$ output of an amplifier U4 is given by:

$$I_{monL} = -I_2 R_{12}$$

Where the $I_{monL}$ output is linearly related to I1 and I2 is substantially equal to I1. This is true as long as the current I1 is less than a value which is given by:

$$I_1 < \left| \frac{I_{monLClipped}}{R_{12}} \right|$$

where $I_{monLClipped}$ is the maximum possible output voltage of amplifier U4. With the circuit operating in Region 1, P-channel MOSFET Q1 is off and the voltage ($V_{in}$) at node 41 is held at approximately zero, resulting in a value of I3 essentially equal to zero. Any value of I3 present in the Region 1 of operation would be due to an input bias current of operational amplifier U3. Thus:

$$I_2 = I_1 5 \ (I_3 + I_2).$$

Figure 5:
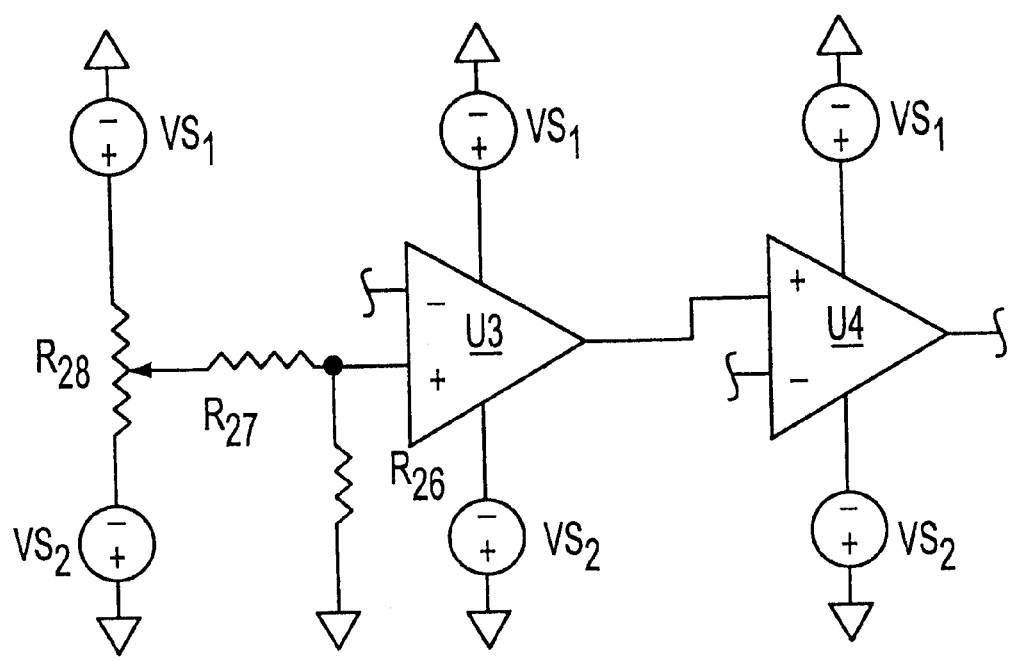
FIG. 5 is a is a partial schematic showing an input offset nulling circuit.

The non-inverting input (+) of amplifier U3 is biased relative to circuit common through resistor R26. The input offset voltage of amplifier U3 may be trimmed out by using an adjusting circuit, such as for example, the potentiometer R28 and the resistor R27 connected as shown in FIG. 5.

The current I2 flowing through resistor R12 produces a voltage I monitor low ($I_{monL}$) relative to circuit common. The current I2 enters the output stage of amplifier U4, returning to circuit common through a VS2 bias supply connection which completes a dc path to the external source of current. A resistor R13 and a capacitor C12 are connected between the output of amplifier U4 and the inverting input of amplifier U3 to create an AC summing junction at the inverting input of amplifier U3. In Region 1, the resistor R13 and the capacitor C12 provide frequency compensation for stability and increased phase margin. The resistor R13 and the capacitor C12 control bandwidth and settling time. Compensation resistor R13 and capacitor C12 are not placed across R12 due to the presence of a capacitor C14 between the node 41 and the circuit common because such a connection would add an additional pole to the open loop gain of the system. The impedance of R11 serves to isolate or separate the AC summing junction at the inverting input of the amplifier U3 and the effective "DC" summing junction at the node 41.

Amplifier U4 is an operational amplifier which is configured as a non-inverting amplifier using resistors R16 and R17 and has a non-inverting fixed dc gain given by:

$$\frac{R_{16}}{R_{17}} + 1$$

The amplifier U4 is used in conjunction with the amplifier U3 to increase the overall gain of the loop and to limit the power dissipation in the amplifier U3. A high loop gain allows the measuring system of FIG. 3 to overcome several of the limitations found in both the parallel and series shunt configurations of FIGS. 1 and 2. Specifically, high loop gain reduces the dc insertion impedance of the circuit in the linear Region 1. Assuming R22 to be large, negative feedback causes the dc insertion impedance between the measurement nodes, indicated as Input and Return in each of FIGS. 3, 4 and 9, of the circuit to be:

$$R_{DC} \approx \frac{(R_{12})}{1+(A1)(A2)} + R_H$$

where A1 is the closed loop dc gain of the amplifier U4 and A2 is the open DC loop gain of the amplifier U3.

The amplifier U3 is selected to have a high open loop gain resulting in a dc insertion impedance that is greatly reduced from the value of R12 alone. At mid frequencies the insertion impedance rises due to a decrease in the open loop gain of U3, but still maintains a low value. At high frequencies capacitor C14 reduces the insertion impedance once again, as the open loop gain eventually falls to a low level.

In the linear region of operation of $I_{monL}$ (Region 1), the voltage between node 41 and common is maintained approximately at the input offset voltage Vos of amplifier U3, assuming R22>>R11. This offset voltage can be trimmed to zero using a circuit comprising a potentiometer R28 and a resistor R27 as shown in FIG. 5. With zero volts across MOSFET Q1 and capacitor C14, any leakage current is eliminated and I3 is kept at a very low value determined primarily by the input bias current of U3. For example, by using an amplifier with a field effect transistor (FET) input stage, the input bias current can be reduced to an extremely low value, which can be considered essentially zero. Thus for all practical purposes,

I2=I1 and $I_{monL}$ very accurately reflects the input current I1.

With the offset voltage trimmed to common, node 41, the source of the MOSFET Q1, is maintained at zero volts because a dead band circuit, comprising diodes D12, D13, D14, and D15 and resistors R18 and R19, is not conducting and the inverting input to amplifier U3 is maintained at circuit common, thus, both nodes of R22 are maintained at zero volts with respect to circuit common. Resistor R24 serves to bypass any small reverse leakage current through diode D12. Amplifier U3 is selected to have a high impedance input stage requiring a small input bias current. In order to smoothly proceed through the five regions of operation shown in FIG. 6, without any hysteresis effects, the effective offset voltage at the inverting input of amplifier U3 must satisfy the following condition:

$$|V_{OSEFF}| < |V_{SGT}|\left(\frac{R_{11}}{R_{22}}\right)$$

where VSGT is the source to gate threshold voltage of the MOSFET Q1. (See also the discussion below regarding Region 3.) Where the nulling circuit shown in FIG. 5 is used, VOSEFF is equal to the trimmed voltage at the inverting input of amplifier U3. If the nulling circuit shown in FIG. 5 is not used, VOSEFF is equal to the input offset VOS of the amplifier U3.

The circuit of FIG. 3 will continue to operate in Region 1 as long as the magnitude of the potential at node 42 ($V_{out}$), which is calculated as:

$$V_{out} = \frac{I_{monL}}{1 + \frac{R_{16}}{R_{17}}}$$

is below a voltage threshold $V_{DBTH}$ of the dead band circuit attributed to the forward voltage drop across diodes D12, D13, D14 and D15. As the current It increases, the voltage $I_{monL}$ will increase in the negative sense until $I2_{max}$ is reached. Where $I2_{max}$ is defined as:

$$I_{2max} = \frac{I_{monLclipped}}{R_{12}}.$$

To further clarify the change in potential of key points in the circuit, a plot of the voltage $V_{out}$ (node 42) versus current I1, a plot of the voltage of $I_{monL}$ versus current I1 and a plot of the voltage $V_{in}$ (node 41), are shown in FIG. 6 for the various regions of operation. It is noted that Region 1 is the most useful operating region in that the $I_{monL}$ output signal is linear and $I_{monL}$ accurately indicates the value of I1.

As I1 continues to increase, the operation mode moves from Region 1 to Region 2 where amplifier U4 and voltage $I_{monL}$ are clipped. Where amplifier U4 clips, the voltage $V_{out}$ at node 42 rises (in the negative sense). The voltage $I_{monL}$ will remain at a clipped value regardless of increases in I1. In this Region, I3 is no longer zero, but flows through R11, R22, diodes D12, D13, D14, D15 and back to circuit common through the bias supply connection VS2 of amplifier U3. The MOSFET Q1 source current is still zero since $V_{gs}$ of the MOSFFET Q1 is below a threshold value. The dc impedance at node 41 is equivalent to the parallel combination of R12 and R11, hence the slope of $V_{in}$ in Region 2 of FIG. 6.

Further increases in the current I1 cause the operation mode to transition to Region 3. During operation in Region 3, the MOSFET Q1 is in saturation:

$$V_{in} - V_G = V_{SG_T}$$

and R21 and C13 are used to assure closed loop stability. In order to insure low impedance at node 41, the MOSFET Q1 is effectively configured as a shunt regulator source follower. This arrangement is utilized because the source follower configuration has an inherently low output resistance.

In Region 3 of FIG. 6, the voltage $V_{in}$ versus I1 rises along with a corresponding change in the voltage $V_{out}$ versus I1.

It should be noted that the slight slope seen on the $V_{in}$ verses I1 curve for Region 3 is related to the gm of the MOSFET Q1 and, assuming a high open loop DC gain of amplifier U3, the slope is calculated as:

$$R_{12} // R_{11} // \left[ \frac{\frac{1}{g_m}}{\left(1 + \frac{R_{22}}{R_{11}}\right)} \right].$$

Figure 7:
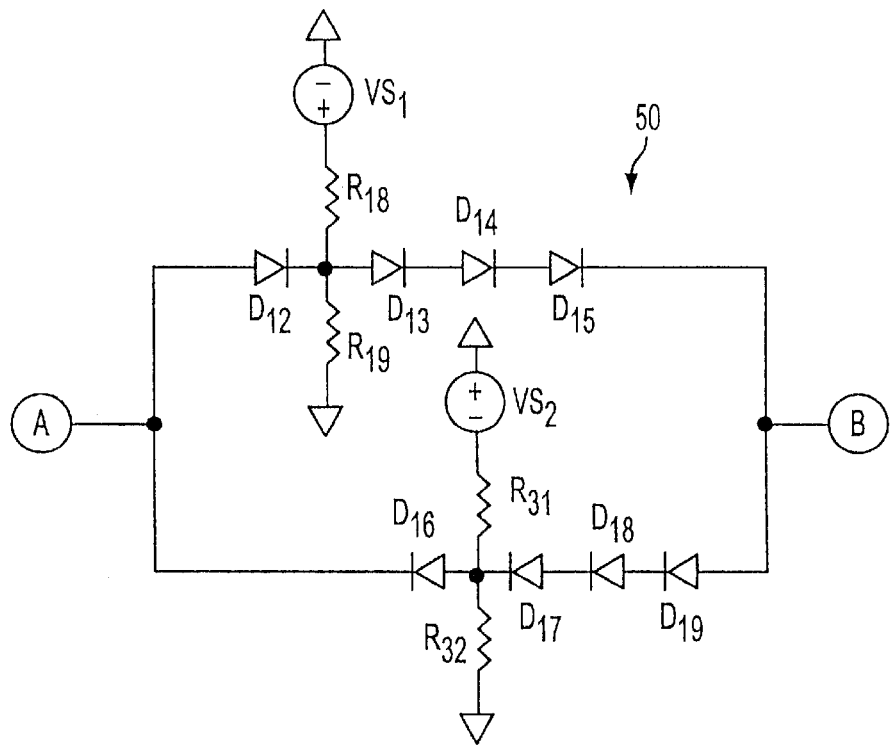
FIG. 7 is a schematic of the deadband circuit shown in FIG. 4.
Figure 8:
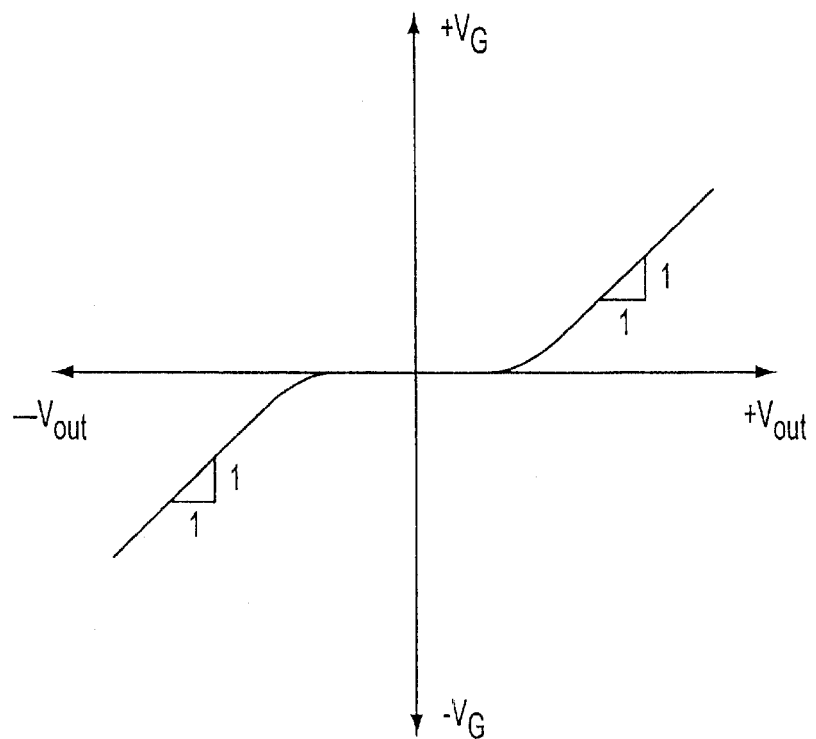
FIG. 8 is a plot of the transfer characteristic of the deadband circuit of FIG. 7.

A schematic of a dead band circuit for a bipolar current measuring system is shown in FIG. 7 and a diagram of the transfer characteristic of the dead band circuit is shown in FIG. 8. With the P-Channel MOSFET Q1 conducting the current I3 which is in excess of $I2_{max}$, the current I3 is determined as:

$$I_3 = \frac{(-V_G)(R_{11})}{(R_{onv})(R_{22})} + \frac{(-V_G)}{R_{22}}$$

where the MOSFET Q1 is treated as a variable resistor given by $R_{onv}$. In Region 3, the MOSFET Q1 resistance is above the minimum achievable $R_{on}$ resistance value.

Further increasing I1 forces MOSFET Q1 to leave saturation and operate in the linear region of the MOSFET Q1 where the drain to source resistance of MOSFET Q1 has dropped to the minimum value, $R_{on}$. The incremental increase in $V_{in}$ is given by:

$$\Delta V_{in} = (\Delta I_3)(R_{on} // R_{12} // R_{11}).$$

Since generally, $R_{on} << (R12//R11)$ the $\Delta V_{in}$ of the MOSFET Q1 may be approximated as:

$$\Delta V_{in} \approx (\Delta I_3)(R_{on}).$$

In Region 3, amplifier U3 is operating linearly and $V_{out}$ (node 42) is not clipped.

The deadband circuit has an incremental gain of 1 (see FIG. 7) when driven beyond a threshold value determined by the forward drop of diodes D12, D13, D14 and D15. Therefore the slope of the $V_{out}$ versus I1 curve in Region 4 of FIG. 6 is:

$$\text{Slope} \approx -\frac{(R_{22})(R_{on})}{R_{11}}.$$

As I1 and $V_{in}$ continue to increase, amplifier U3 output voltage $V_{out}$ increases negatively to maintain linear operation. However, the maximum negative output voltage of amplifier U3 is limited by supply voltage VS2. In FIG. 6, the transition of $V_{out}$ from Region 4 to Region 5 occurs at a point where amplifier U3 saturates and ultimately limits $V_{out}$. The slope of the $V_{in}$ verses I1 curve in Region 5 is given by:

$$R_{on} // R_{12} // (R_{11} + R_{22}) \approx R_{on},$$

which equation is valid as long as I1 is less than $I1_{max}$ and the MOSFET Q1 resistance remains at $R_{on}$. Both $I1_{max}$ and the saturation region are shown in FIG. 6. Input currents in excess of $I1_{max}$ will drive the MOSFET Q1 into the saturation region, with a corresponding rapid increase of $V_{in}$ at node 41. Proper selection of Q1 will prevent operation in this non-preferred region. As I1 decreases, operation of the circuit will progress through the regions discussed in the reverse sequence of the order discussed above.

Figure 4:
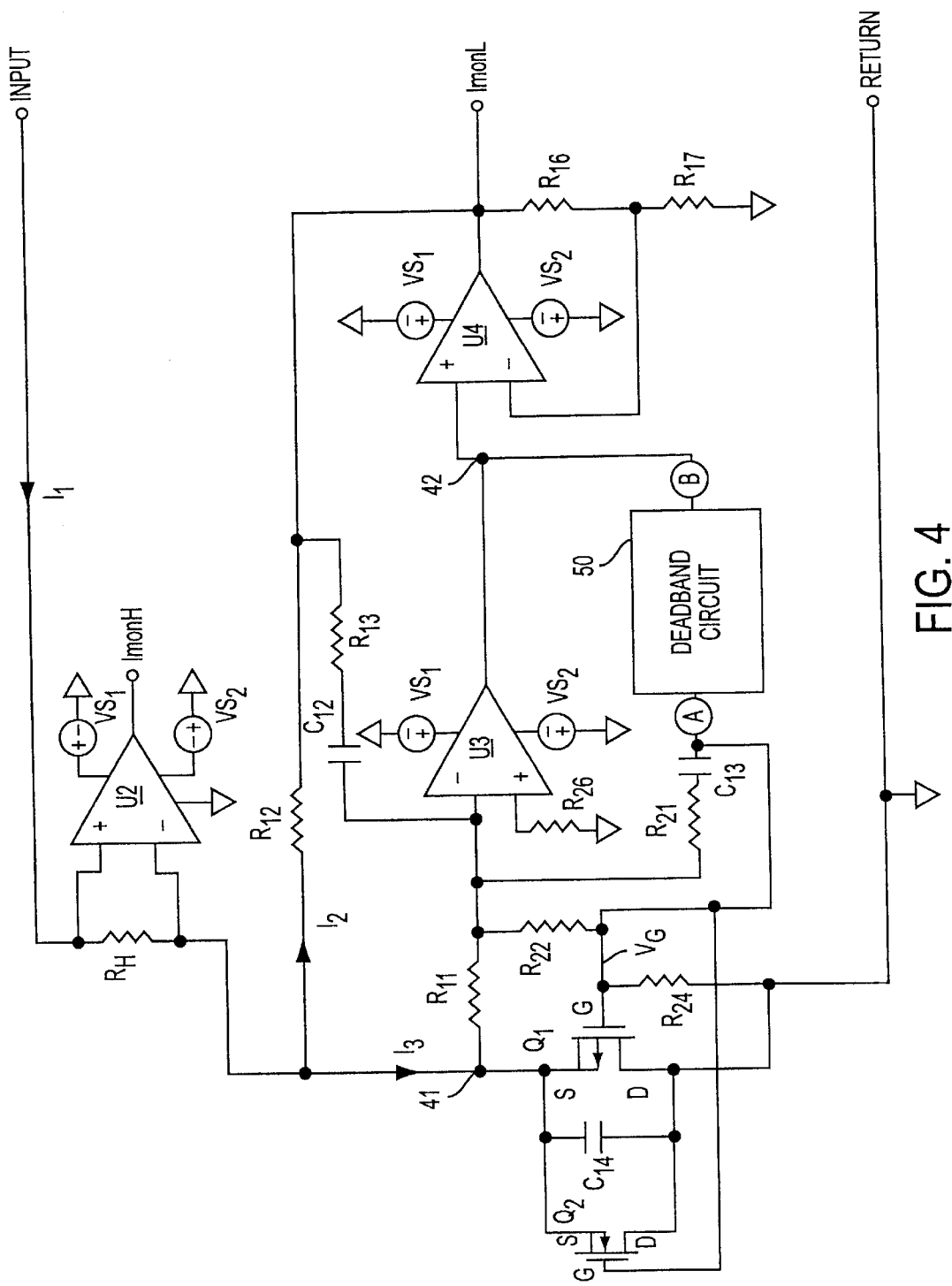
FIG. 4 is a schematic diagram of a bipolar embodiment of the present invention.

Referring now to FIG 4, a bipolar multiple range current measuring system is illustrated. The bipolar measuring system shown in FIG. 4 is similar to the unipolar measurement system shown in FIG. 3. The bipolar measuring system shown in FIG. 4 additionally comprises an N channel MOSFET Q2 and diodes D16, D17, D18, and D19, resistors R31 and R32. Diodes D12, D13, D14, D15, D16, D17, D18 and D19, resistors R18, R19, R31 and R32 comprise a bipolar deadband circuit 50. The arrangement of the deadband circuit and the interconnections thereof with VS1, VS2 and circuit common are shown in FIG. 7. The deadband circuit 50 is connected into the circuits of FIGS. 4 and 9 according to the designations A and B shown in FIGS. 4, 7 and 9. Diodes D16, D17, D18 and D19, resistors R31 and R32 and MOSFET Q2 allow the measurement systems of FIGS. 4 and 9 to operate with current I1 flowing in either the positive (as shown) or the negative direction (opposite that shown). Where the direction of current I1 is negative, the voltage $I_{monL}$, and the potential at node 42 ($V_{out}$), with respect to common, will be positive. As the current I1 increases negatively, amplifier U4 will clip in a positive direction and the potential at node 42 ($V_{out}$) will increase in a positive direction. This will cause diodes D16, D17, D18, and D19 to conduct and apply an increasingly positive voltage to the gate of MOSFET 02, causing MOSFET 02 to enter saturation. Further increasing the value of $I1_1$ in the negative direction will cause the circuit to analogously follow the same sequence of events discussed in relation to FIG. 3. It will be readily understood that the voltage plots of FIG. 6 and the discussion regarding FIG. 3 analogously apply to negative currents, by simply reversing the polarities shown on FIG. 6 for each of +Volts, −Volts and I1.

The present embodiment overcomes each of the problem areas of the series and parallel shunt measurement systems. In the prior art, the insertion impedance of the measurement system is often high and changes drastically as various shunts are switched on and off. This can disturb the external current flow due to changes in the impedance of the measuring circuit. The present system minimizes the insertion impedance $R_{DC}$ of the measurement circuit at all frequencies and modes of operation by dividing the shunt impedance R12 according to the equation:

$$R_{DC} = \frac{R_{12}}{1 + (A1)(A2)} + R_H,$$

where A1 is the closed loop gain of the amplifier U4 and A2 is the open loop DC gain of the amplifier U3, and by using low $R_{on}$ MOSFETS for higher currents in Regions 2, 3, 4, and 5. The low $R_{on}$ MOSFETS also not only reduce power dissipation but also reduce the common mode voltage applied between amplifier U2 input and common, which reduces measurement errors in the $I_{monH}$ circuit. Using the nulling circuit shown in FIG. 5, zero volts can be maintained across the bypass MOSFETS Q1 and Q2 to prevent leakage current from flowing. The present invention greatly improves DC measurement accuracy compared with a conventional differential amplifier and shunt configuration.

Figure 9:
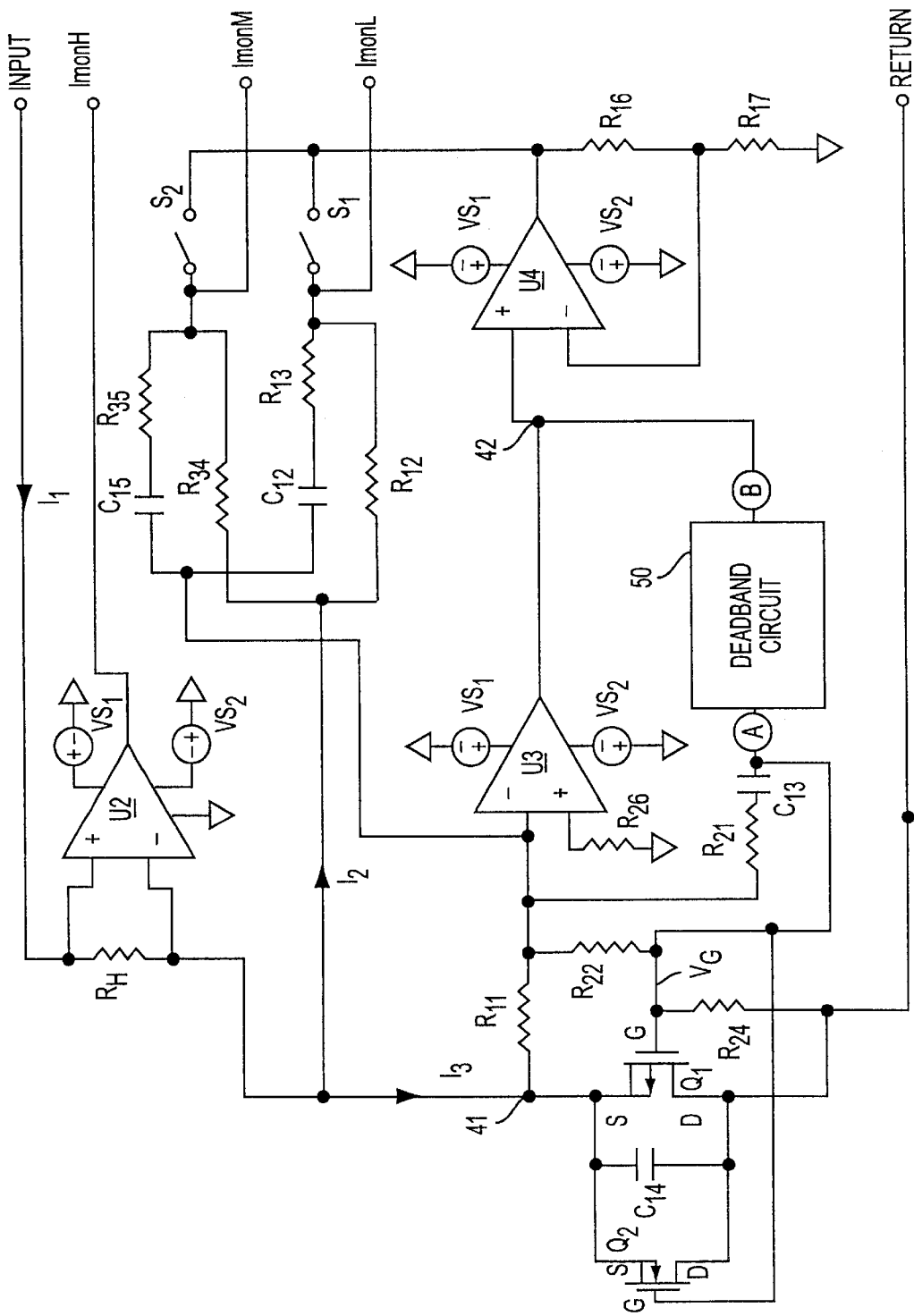
FIG. 9 is a schematic of an arrangement that provides additional measurement ranges.

The concepts of this invention may be extended to allow for an arbitrary number of current measurement ranges. FIG. 9 is a schematic diagram which illustrates how the circuits of FIG. 3 and FIG. 4 are altered for measurements in an additional mid current range. To accomplish this switches S1 and S2 are added to direct the current to flow through an appropriate feedback resistor and compensation network. The measurement voltage $I_{monM}$ or $I_{monL}$ is taken in a manner to avoid a measurement error due to the resistance of the respective switch. Capacitor 015 and resistors R34 and R35 perform similar functions as capacitor C12 and resistors R12 and R13, respectively, perform in the measurement system discussed with reference to FIGS. 3 and 4. Otherwise the circuit of FIG. 9 operates in a similar manner as the circuit of FIG. 4.

Switches S1 and S2 are activated by suitable means such as for example, user selection to select one of $I_{monM}$ and $I_{monL}$ as a desired range. Switches S1 and S2 should be operated in a make-before-break fashion to provide for minimum disruption. As in the embodiments shown in FIGS. 3 and 4, the shunts cannot be over powered because excessive current is automatically shunted away from the high value measurement resistors by the bypass transistors Q1 and Q2.

Figure 2:
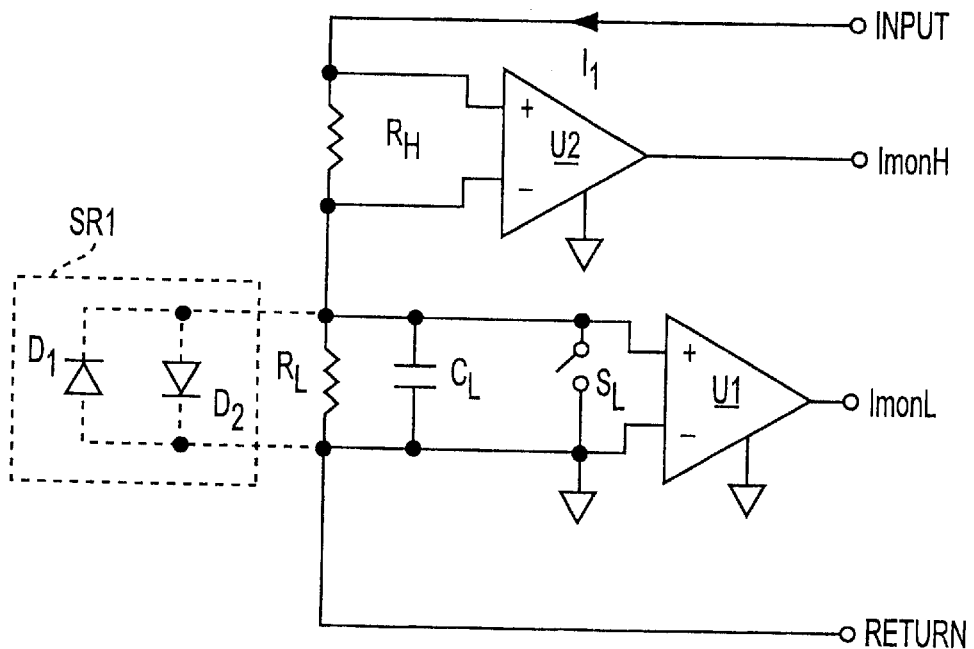
FIG. 2 is a schematic diagram of a conventional series shunt dual range measuring circuit.

In summary, the prior art parallel shunt circuit of FIG. 1 requires complex switch control of the measurement shunts in order to perform the make-before-break switching operation, which does not occur automatically. This can result in disruption of external current flow and in the measurement shunts being momentarily overpowered. The prior art series shunt circuit of FIG. 2 has the disadvantages of power dissipation and leakage in the shunt regulator SR1 or problems with the control and lifetime of switch $S_L$ if the shunt regulator SR1 is not used. In the present invention measurement range changes occur automatically without the use of mechanical relays to change measurement shunts. Elimination of mechanical relays alleviates concerns regarding contact bounce and contact lifetime.

In the present invention, excess current is automatically shunted away from lower range measurement components via the bypass MOSFETS. As the measurement current increases, the lower range measurements will clip in a manner which does not affect measurement accuracy or cause harm to the circuit Although preferred embodiments of the present invention have been shown and described, it will be appreciated by those skilled in the art that changes may be made in these embodiments without departing from the principle and spirit of the invention, the scope of which is defined in the appended claims and their equivalents.

What is claimed is:

1. A multi-range measuring circuit for measuring a flow of electrical current, the circuit comprising:
   an in-line sensor which outputs a first signal proportional to the current and having a first scale factor;
   an amplifier circuit having an input serially connected with the in-line sensor and which outputs a second signal proportional to the current and having a second scale factor greater than the first scale factor; and
   a bypass circuit which bypasses a portion of the current around the amplifier circuit at values of the input current where the amplifier circuit is non-linear.

2. The multi-range measuring circuit as claimed in claim 1, wherein the in-line sensor is a resistor.

3. The multi-range measuring circuit as claimed in claim 1, wherein the amplifier circuit comprises an inverting amplifier serially connected with a non-inverting amplifier.

4. The multi-range measuring circuit as claimed in claim 3, wherein the non-inverting amplifier outputs the second signal.

5. The multi-range measuring circuit as claimed in claim 3, wherein the inverting amplifier outputs a control signal to operate the bypass circuit.

6. The multi-range measuring circuit as claimed in claim 1, wherein the bypass circuit comprises a transistor.

7. The multi-range measuring circuit as claimed in claim 1, wherein the bypass circuit comprises a P-type MOSFET.

8. The multi-range measuring circuit as claimed in claim 1, wherein the bypass circuit comprises an N-type MOSFET.

9. The multi-range measuring circuit as claimed in claim 1, wherein the bypass circuit comprises a P-type MOSFET parallel connected with an N-type MOSFET.

10. The multi-range measuring circuit as claimed in claim 5, wherein the inverting amplifier outputs the control signal via a deadband circuit interposed between the inverting amplifier and the bypass circuit.

11. The multi-range measuring circuit as claimed in claim 10, wherein the deadband circuit passes the control signal where a value of the control signal is greater than a first predetermined value or less than a second predetermined value and rejects the control signal where the value of the control signal is intermediate the first and second predetermined values.

12. The multi-range measuring circuit as claimed in claim 11, wherein the inverting amplifier operates in a first control loop where the deadband circuit rejects the control signal and operates in a second control loop where the deadband circuit passes the control signal.

13. A multi-range measuring circuit for measuring a flow of electrical current between a first node and a second node, the circuit comprising:
    a summing node;
    a resistor which conducts the current from the first node to the summing node;
    a first amplifier having a differential input connected across the resistor, to output a first signal representative of a value of the current and according to a first scale factor;
    an inverting amplifier having an input connected to the summing node;
    a non-inverting amplifier connected to an output of the inverting amplifier to output a second signal;
    a feedback resistor connected between an output of the non-inverting amplifier and the summing node, to regulate the second signal to be proportional to the current and according to a second scale factor;
    a detector which outputs a control signal where the second signal is greater than a first predetermined value or less than a second predetermined value; and
    a bypass circuit which bypasses a portion of the current from the summing node to the second node according to the control signal.

14. The multi-range measuring circuit as claimed in claim 13, wherein the control signal is output if a sum of the current and a feedback current flowing through the feedback resistor is greater than a predetermined positive value or less than a predetermined negative value.

15. The multi-range measuring circuit as claimed in claim 13, further comprising a second feedback resistor which is operative between the output of the inverting amplifier and the input of the inverting amplifier if the control signal is output.

16. The multi-range measuring circuit as claimed in claim 13, wherein the control signal is output if the output of the inverting amplifier is greater than a predetermined positive value or less than a predetermined negative value.

17. The multi-range measuring circuit as claimed in claim 16, wherein the respective predetermined positive and negative values are determined by a diode network.

18. The multi-range measuring circuit as claimed in claim 17, wherein the diode network comprises a plurality of series connected junction diodes.

19. A multi-range measuring circuit for measuring a flow of electrical current between a first node and a second node, the circuit comprising:
- a resistor which is connected in series between the first node and a third node and which senses the current flow, to output a first voltage representative of the current and having a first scale factor;
- a bypass circuit which is serially connected with the third node and the second node, the bypass circuit having a non-conductive state and a conductive state according to a control signal;
- an amplifier circuit connected to the third node, to output a second voltage representative of a value of the current and to return the current to the second node, the second output voltage having a second scale factor; and
- a detector which outputs the control signal to place the bypass circuit in the conductive state, if the magnitude of the current exceeds a predetermined value.

20. The multi-range measuring circuit as claimed in claim 19, wherein the amplifier circuit comprises serially connected first and second amplifiers operative in a closed loop between the third node and the second voltage output and wherein the predetermined value is an output saturation value of the second amplifier.

* * * * *